(12) United States Patent
Erickson et al.

(10) Patent No.: US 9,589,653 B1
(45) Date of Patent: Mar. 7, 2017

(54) CREATING DEFAULT STATES FOR NON-VOLATILE MEMORY ELEMENTS

(71) Applicant: International Business Machines Corporation, Armonk, NY (US)

(72) Inventors: Karl R. Erickson, Rochester, MN (US); Robert E. Kilker, Rochester, MN (US); Phil C. Paone, Rochester, MN (US); David P. Paulsen, Inver Grove Heights, MN (US); Gregory J. Uhlmann, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/070,499

(22) Filed: Mar. 15, 2016

(51) Int. Cl.
| | |
|---|---|
| *G11C 11/34* | (2006.01) |
| *G11C 16/24* | (2006.01) |
| *G11C 16/10* | (2006.01) |
| *G11C 16/26* | (2006.01) |

(52) U.S. Cl.
CPC ............... *G11C 16/24* (2013.01); *G11C 16/10* (2013.01); *G11C 16/26* (2013.01)

(58) Field of Classification Search
CPC .......... G11C 16/24; G11C 16/10; G11C 16/26
USPC ............ 365/185.23, 185.06, 185.03, 185.05, 365/185.11, 185.13, 185.18
See application file for complete search history.

(56) References Cited

U.S. PATENT DOCUMENTS

| | | | |
|---|---|---|---|
| 7,528,646 B2 | 5/2009 | Aipperspach et al. | |
| 8,294,475 B2 | 10/2012 | Fellner | |
| 2006/0164884 A1 | 7/2006 | Wu | |
| 2007/0274118 A1 | 11/2007 | Audy et al. | |
| 2015/0095728 A1 | 4/2015 | Lu et al. | |
| 2015/0221377 A1 | 8/2015 | Norman | |
| 2015/0262671 A1* | 9/2015 | Sugimae | ............ G06F 13/4022 710/316 |

FOREIGN PATENT DOCUMENTS

WO       2005043457 A1       5/2005

OTHER PUBLICATIONS

Erickson et al., "Detection of Initial State by Efuse Array", U.S. Appl. No. 14/921,245, filed Oct. 23, 2015.
Kilker et al., "Non-Volatile Memory Sense Circuit", U.S. Appl. No. 14/574,462, filed Dec. 18, 2014.

(Continued)

*Primary Examiner* — Fernando Hidalgo
(74) *Attorney, Agent, or Firm* — Nathan M. Rau

(57) ABSTRACT

A circuit has a wordline with an NVM element utilizing a first FET coupled to bitline true and a second FET coupled to bitline complement. A NFET coupled to the bitline complement is configured to pull bitline true toward ground in response to bitline complement reaching a first voltage. One or more wordline drivers are coupled to the NVM element such that a first path from a wordline driver is coupled to the first FET while a second path from a wordline driver is coupled to the second FET. The first path is current-limited in comparison to the second path, such that a first slew rate between a wordline driver and the first FET is slower than a second slew rate between a wordline driver and the second FET. The slew rate disparity allows the bitline complement to reach the first voltage.

15 Claims, 4 Drawing Sheets

(56) References Cited

OTHER PUBLICATIONS

Kilker et al., "Non-Volatile Memory Sense Circuit", U.S. Appl. No. 14/576,325, filed Dec. 19, 2014.
Reddy et al., "Decoupled Logic Based Design for Implementation Low Power Memories by 8T SRAM", International Journal of Computer Applications in Engineering Sciences, vol. II, Issue 1, Mar. 2012. pp. 43-47.

* cited by examiner

CREATING DEFAULT STATES FOR NON-VOLATILE MEMORY ELEMENTS

BACKGROUND

The present disclosure relates to computer memory, and more specifically, to macros utilizing non-volatile memory.

Non-volatile memory is computer memory which can retain stored information even when not powered. Some types of non-volatile memory may contain field-effect transistors which may be programmed. Charge trapping can be used to shift the threshold voltage of field-effect transistors.

SUMMARY

According to embodiments of the present disclosure a method and circuit for creating default values for non-volatile memory (NVM) elements using field-effect transistors (FETs) of a NVM array is disclosed. A circuit may have a wordline with at least one NVM element. The NVM element may include a first FET coupled to bitline true of the NVM element and a second FET coupled to bitline complement of the NVM element. The first and second FET may be substantially similar to each other. The circuit may have a first NFET coupled to the bitline complement and a second NFET coupled to the bitline true. The first NFET may be configured to pull the bitline true toward ground in response to the bitline complement reaching a first voltage. Reaching this first voltage gives the NVM element a default logical state. The second NFET may be configured to pull the bitline complement toward ground in response to the bitline true reaching a second voltage. Reaching this second voltage gives the NVM element a programmed logical value distinct from the default logical value. The circuit may include at least one wordline driver coupled to the NVM element. The wordline driver may be coupled to NVM element such that a first path from the wordline driver is coupled to the first FET while a second path from the wordline driver is coupled to the second FET. The first path may be current-limited in comparison to the second path, such that the slew rate heading to the first FET will be slower than the slew rate heading into second FET when a wordline for the signal is raised. The slower slew rate of the first FET may allow the bitline complement to reach the first voltage.

The above summary is not intended to describe each illustrated embodiment or every implementation of the present disclosure.

BRIEF DESCRIPTION OF THE SEVERAL VIEWS OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
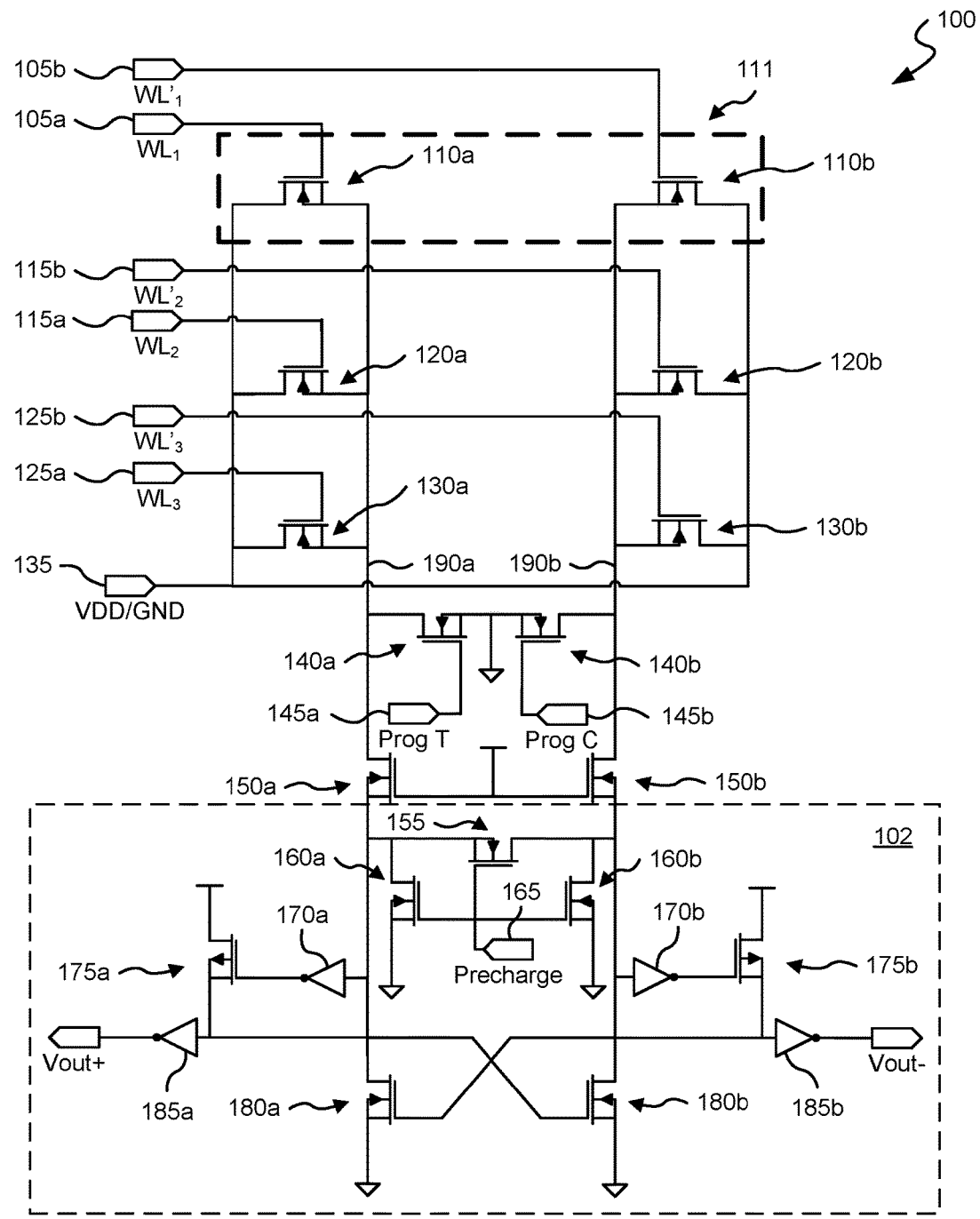
FIG. 1 depicts a diagram of a circuit capable of receiving different slew rates for substantially similar field-effect transistors (FETs) of non-volatile memory (NVM) elements along with a sensing circuit for sensing the logical state of the NVM elements, according to embodiments.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to a memory array comprised of non-volatile memory elements (NVMs). An NVM element is comprised of two substantially similar field-effect transistors (FETs). The two FETs receive different slew rates as a result of one or more unbalanced wordline drivers. The differing slew rates reliably allow one FET of the NVM element to turn on quicker, creating a default logical state for the NVM element. The wordline of the NVM element is read, and if any NVM elements of the wordline have been programmed the wordline drivers may be balanced. While the present disclosure is not necessarily limited to such applications, various aspects of the disclosure may be appreciated through a discussion of various examples using this context.

In instances, where traditional memory arrays utilize two substantially similar FETs, drive strength may be balanced across a bitline, such that substantially equal drive strength raises all FETs of the wordline. As the wordline of a traditional NVM element with balanced channel width is raised, a bitline true or complement may turn on first as a result of threshold voltage (Vt) variation in the cell, which, across a plurality of NVM elements, provides an equal likelihood of respective bitlines of the plurality of NVM elements being the first to turn on. This will result in the created memory array not having a predictable known memory state. A lack of a predictable default logical state therein results in the NVM element having an equal likelihood of being constructed as a logical zero or a logical one. Without a known state it may be difficult or impossible for a system to determine if such traditional NVM elements have been programmed or not. Given that the programmed status of such traditional NVM elements may be difficult or impossible to determine, testing said traditional NVM elements with standard testing flows may be itself difficult or impossible.

Aspects of the disclosure relate to unbalancing the driver (s) for both sides of an NVM element that utilizes a plurality of FETs to create a default logical state. The NVM element includes two substantially similar FETs (e.g., both FETs have substantially similar channel width) and is one of a plurality of NVM elements within an NVM array. A single wordline driver for the wordline of the NVM element may be split into two paths and sent through disparate transmission gates, resulting in unequal impedence upon the two eventual signals. One of the two paths may be coupled to one of the two FETs of the NVM element, while the other signal is coupled to the other FET, respectively. By coupling disparate wordline drivers to the two FETs of the NVM element, the FETs will receive different slew rates (e.g., the two slew rates will be different coming out of the wordline driver and transmission gates), allowing the FET with the faster slew rate to pull up its bitline faster than the complement FET, therein starting a logical sequence which will reliably create a default logical state for the NVM element.

The NVM element can be programmed by changing the Vt of the FET with the faster slew rate, allowing the FET with the slower slew rate to pull up its bitline faster (and therein switching the logical state of the NVM element). The NVM array includes logic that determines whether an NVM element has been thusly programmed. In response to detecting that an NVM element of a wordline has been programmed, the NVM macro may balance the wordline driver for the wordline (e.g., by deactivating a disparate transmission gate and activating a matching transmission gate). Upon balancing the wordline drivers for the two FETs of the NVM elements of the wordline the NVM macro may output the programmed values of the NVM elements of the wordline. Constructing an NVM element such that it has a default logical state may have testing benefits as well as other benefits associated with avoiding NVM elements with no default logical state.

Embodiments of the disclosure may relate to circuits that utilize NVM elements with substantially similar FETs that nonetheless receive unbalanced slew rates, as well as a sense circuit for sensing the state of such NVM elements. Each NVM element may have one FET coupled to bitline true of the NVM element and one FET coupled to bitline complement of the NVM element. The slew rates that feed into/are received by the two FETs may be unbalanced as a result of a current-limiting transmission gate being coupled to the wordline driver for one FET (said FET hereinafter referred to as the slow FET) while a relatively non-current-limiting transmission gate is coupled to the wordline driver for the other FET (said FET hereinafter referred to as the fast FET).

Two FETs are balanced across a bitline for an NVM element, which is to say that one FET is coupled to bitline true while the other is coupled to bitline complement and both FETs have a substantially equal channel width. Both FETs may be coupled to a single wordline driver through two driver paths (e.g., one driver path for the bitline true FETs of the wordline and one driver path for the bitline complement FETs of the wordline). Both driver paths may be coupled to at least one transmission gate that is located between the wordline driver and the FETs of the wordline. The default transmission gates (e.g., the transmission gates that are active at wafer test) may be unbalanced (e.g., one transmission gate is current-limiting relative to the other transmission gate). The transmission gates may be sufficiently unbalanced to reliably overpower the random Vt variations in the FETs of the NVM element and the sense amplifier, resulting in a reliable default logical state for the NVM element. Before an NVM element is programmed, as the wordline signal increases, the FET coupled to the current-limiting transmission gate (e.g., the slow FET) will have a lower slew rate than the opposing FET (e.g., the fast FET), resulting in the fast FET completing the process of turning on before the slow FET turns on. By turning on first, the fast FET may pull its corresponding bitline first (e.g., pulling up a bitline for the fast FET faster than the bitline connected to the slow FET).

As used hereinafter, the slow FET (e.g., the FET coupled to the current-limiting transmission gate resulting in a lower slew rate) is the FET coupled to the bitline true for the NVM element, resulting in a default logical state of zero at the output of the inverter 185a(e.g., as a result of the NVM macro described herein). It is to be understood that the slow FET can also be the FET coupled to the bitline complement which may result in a different default logical state depending upon the NVM macro. However, for purposes of clarity, the slow FET will be discussed as being the FET coupled to the bitline true, and the default logical state will be discussed as zero.

As the wordline signal rises, the NVM macro reads the NVM elements of the wordline to verify that all NVM elements read as the default logical state. If all NVM elements do indeed read as the default logical state, this state is passed to the primary output of the NVM array. An NVM element may be programmed to a logical state other than the default logical state. The NVM element may be programmed by increasing the VT of the fast FET such that the slow FET connected to the current-limiting transmission gate will turn on quicker. As the wordline signal is raised, the slow FET (e.g., the unprogrammed FET) will turn on first, pulling its corresponding bitline faster than the bitline connected to the fast FET (e.g., the programmed FET).

The NVM macro includes a sense circuit to read the NVM elements. The sense circuit includes large cross-coupled n-channel FETs (NFETs) connected to bitlines. The bitline which rises first turns on the NFET connected to the opposing bitline which pulls the opposing bitline towards ground, therein preventing the opposing bitline from turning on the second NFET. This may keep the bitline for the unprogrammed FET high and the bitline for the programmed FET low.

In some embodiments, bitlines are further connected to a p-channel FET (PFET) keeper device which finishes the bitline, therein activating the corresponding NFET to full supply voltage (Vdd). Further, bitlines may be connected to inverters which output a signal for the sense circuit based on the voltages of respective bitlines.

Referring to FIG. 1, a diagram of an example memory circuit 100 with a sensing circuit 102 for sensing the programming of an NVM element is depicted. In some embodiments, the NVM element is an eFuse. Circuit 100 includes three NVM elements which utilize unbalanced wordline drivers for FETs of respective NVM elements to create a default logical state for the NVM elements as described herein. In some embodiments the wordline drivers may be later balanced when the NVM macro detects that NVM elements have been programmed to a logical state other than the default logical state. The wordline drivers may be later balanced as described herein to better output programmed values of the NVM elements.

Figure 2A:
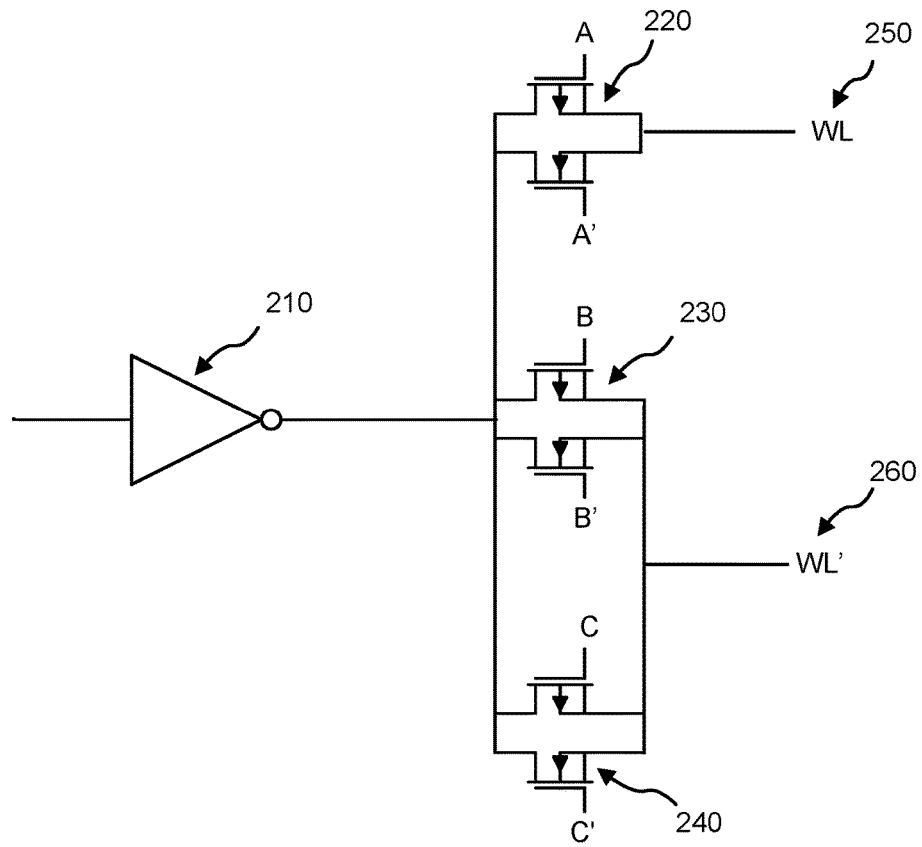
FIG. 2A depicts a diagram of a wordline driver and transmission gates that result in different slew rates for substantially similar FETs of an NVM element, according to embodiments.

Wordline drivers of FIG. 1 may be unbalanced as depicted in FIG. 2A, wherein a single wordline driver splits into two unbalanced paths. The paths may be unbalanced as a result of disparate transmission gates, such that one transmission gate limits current relative to the paired transmission gate on the other path. One path of the wordline driver may be coupled to the FETS on bitline true of each NVM element of the wordline, while the other path of the same wordline driver is coupled to the respective bitline complement FETs of the respective NVM elements of the wordline. When the wordline drivers are balanced as described herein, in such embodiments the wordline driver paths may deactivate the disparate transmission gate and activate one or more substantially similar transmission gates. However, for purposes of clarity, FIG. 1 depicts distinct wordline driver pairs 105a and 105b, 115a and 115b, and 125a and 125b, wherein wordline driver pairs are coupled to the complementary bitlines of a NVM element on respective wordlines.

A wordline driver pair 105a and 105b, 115a and 115b, 125a and 125b is unbalanced in that one wordline driver of a pair has relatively limited current in comparison to the other wordline driver of the pair. While either wordline driver of a pair may be the current-limited driver of the two, for purposes of clarity wordline drivers 105b, 115b, and 125b are described herein as being the current-limited in comparison to 105a, 115a, and 125a, respectively. The FET 110b, 120b, 130b coupled to the wordline driver 105b, 115b, 125b therein receive/are feed slower slew rates (e.g., the two slew rates will be different coming out of the respective wordline drivers and/or transmission gates) and therefore are the slow FETs. FETs 110a, 120a, and 130a are the fast FETs. The wordline driver pairs may be balanced by techniques known to one skilled in the art, such as the manner described herein.

To program one of the FETs of an NVM element, a high voltage may be applied to the FET through the corresponding wordline and supply voltage 135. In some embodiments an NVM element is reliably created with a default logical state, so FETs may only be programmed in order to switch to the alternate logical state. In such embodiments, the high programming voltage must be applied to the fast FET, such that its Vt is increased sufficiently to delay the rising of the corresponding bitline to "lose" to the opposing bitline coupled to the slow FET.

The bitline for the FET to be programmed (e.g., the fast FET) may be grounded to provide a path of electrons through the FET. Electrons may be trapped in the gate dielectric of the NFET or holes trapped in the gate dielectric of the PFET, either of which may lead to a higher absolute Vt for the respective FET type. In other embodiments, the circuit of FIG. 1 may be completed in a complimentary manner, using PFETs instead of NFETs. Being as fast FETs are depicted/discussed as FETs 110a, 120a, and 130a, program true 145a may be activated to turn on FET 140a and bring bitline 190a down to ground to program either FET 110a, FET 120a, or FET 130a. Similarly, if fast and slow FETs were switched, program complement 145b may be activated to turn on FET 140b and bring bitline 190b down to ground to program either FET 110b, FET 120b or FET 130b.

For example, to program FET 110a, wordlines 105a-b and supply voltage 135 are set to a high voltage. Program true 145a is made high to activate FET 140a and pull bitline 190a toward ground. This causes high energy electrons (charge carriers) to flow through the channel of FET 110a and become trapped in the gate dielectric of the device causing the absolute value of the Vt to increase.

FETs 150a-b may be configured to protect sense circuit 102 from the high voltage produced during the programming of NVM elements.

To prepare for sensing an NVM element, bitlines 190a-b may be precharged to ground and balanced. Precharge 165 may be brought high to activate NFET 155, which balances bitlines 190a-b, and to activate NFETs 160a-b to bring bitlines 190a-b to ground. Supply voltage 135 is applied and the wordline applied to the applicable NVM element rises. A slow wordline slew may be used to help differentiate between the programmed and unprogrammed FETs in the NVM element. For example, a slow wordline slew may identify increases of 10% Vdd to 90% Vdd in about 200-800 ps (picoseconds). As the wordline voltage increases, it may activate the FETs of the NVM element, causing the voltage of the corresponding bitlines to increase. The programmed FET(s) may turn on last as it has a higher Vt. Thus, the bitline connected to the unprogrammed FET(s) may increase faster than the bitline connected to the programmed FET.

NFETs 180a-b may be configured to pull the connected bitline to ground when turned on by the other bitline. NFET 180a is configured to pull bitline 190a toward ground in response to the increase in voltage of bitline 190b. Similarly, NFET 180b is configured to pull bitline 190b toward ground in response to the increase in voltage of bitline 190a. Thus, the bitline whose voltage rises faster may keep rising while preventing the other bitline from rising. NFETs 180a-b may be much larger than the FETs of the NVM elements such that they overpower the FET(s) quickly when pulling the corresponding bitline to ground.

Additionally, inverters 170a-b and PFETs 175a-b may be configured to pull the faster rising bitline to full Vdd rail. Inverters 170a-b may be configured to change output from high to low once the input bitline reaches a specified voltage. The low output may turn on the corresponding PFET 175a or 175b, which therein brings the bitline to full Vdd rail.

Inverters 185a-b may provide output from sense circuit 102. Inverter 185a may provide the main output for sense circuit 102. For example, a high output from inverter 185a may represent a logical one and a low output may represent a logical zero.

The circuit 100 may include logic to verify whether or not NVM elements have been programmed. This logic may take the form of two read functions. The first read function may use techniques known to one skilled in the art (e.g., a sequence of OR transmission gates) to determine whether or not any NVM elements have a logical value other than the default logical value. As described herein, the circuit determines whether any NVM elements have a logical value of one, which would indicate that the NVM element has been programmed. If the control logic determines that any NVM element of a wordline has been programmed, the circuit 100 balances the wordline pair for the respective wordline of the respective programmed NVM element. The wordline pair may be balanced by techniques known to one skilled in the art, such as the one described herein. Balancing the wordline prevents sense amps from having to overcome the sense margin penalty of the slower slew differential. Once balanced, the circuit 100 completes the second read function with the balanced wordline driver pair for the programmed wordline and sends the programmed values to the primary output.

For example, assume FET 120a has been programmed. To read the memory cell containing FETs 120a-b, bitlines 190a-b are balanced and brought to ground with precharge 165. Precharge 165 is turned off and wordlines 115a-b are slowly raised. Wordline driver 115b has a path that is current-limited compared to wordline driver 115a and FET 120b has a lower Vt than FET 120a. The relatively lower Vt will be enough to overwhelm the current-limited path, thus FET 120b will turn on first and cause bitline 190b to rise before bitline 190a. Bitline 190b will turn on NFET 180a which will pull bitline 190a toward ground. Inverter 170b will change its output to low in response to rising bitline 190b and activate PFET 175b to bring bitline 190b to Vdd rail. The main output from inverter 185a will be high (i.e. logical one) in response to bitline 190a being low and the output of inverter 185b will be low in response to bitline 190b being high. Sense circuit 102 may stay in this state until a new precharge to ground. In response to the main output from inverter 185a being high (e.g., in response to the NVM element being programmed), wordline driver 115a and 115b are balanced by the NVM macro according to techniques known to one skilled in the art, such as the technique described in FIG. 2A below. After the wordline drivers 115a and 115b are balanced, the process of this paragraph repeats itself and the programmed values of the NVM elements are sent to the primary output of the circuit 100.

FIG. 2A depicts a diagram of a wordline driver and accompanying transmission gates to balance or unbalance wordline driver paths to true and complement bitline FETs of a wordline. The wordline driver 210 is shown coupled to three transmission gates 220, 230, 240. Transmission gate 220 and transmission gate 230 are substantially similar, while transmission gate 240 is a relatively smaller transmission that limits current relative to transmission gates 220 and 230. As described herein, transmission gates 230 and 240 are coupled to a wordline path 260 that is coupled to the bitline complement FETs of NVM elements on the wordline of the wordline driver 210. Thus transmission gate 220 is coupled to the bitline true FETs of NVM elements on the wordline of the wordline driver 210. It is to be understood that in other embodiments smaller transmission gates could instead be coupled to FETs on the bitline true of NVM elements rather than the bitline complement as described herein.

Upon creation, both the transmission gate 220 and the relatively smaller transmission gate 240 are activated. Accordingly, as described herein, the slew rate feeding into FETs coupled to the transmission gate 240 be slower than the slew rate feeding into FETs coupled to the relatively larger transmission gate 220 (e.g., the two slew rates will be different coming out of the wordline driver 210 and transmission gates 220, 230, 240). Once a FET coupled/connected to wordline driver 210 is programmed as described herein, the wordline paths 250, 260 may be balanced. Paths of the wordline driver 210 may be balanced by deactivating transmission gate 240 and activating transmission gate 230. Transmission gate 230 may be activated and transmission gate 240 may be deactivated by control logic techniques known to one skilled in the art. Given that transmission gate 230 is substantially similar to transmission gate 220, FETs of the wordline of wordline driver are thus coupled to a balanced driver.

Figure 2B:
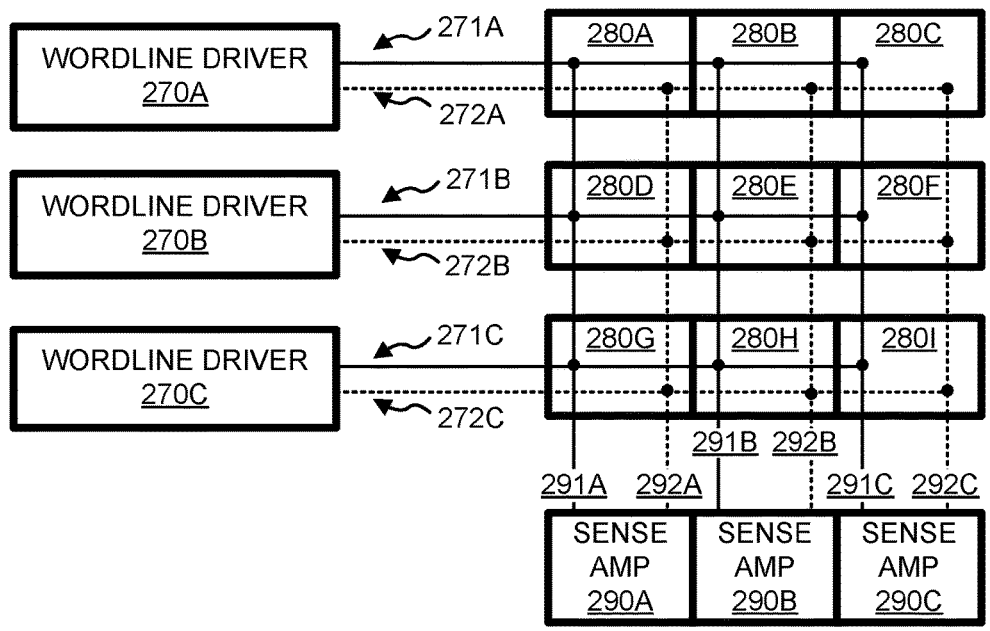
FIG. 2B depicts a diagram of unbalanced wordline drivers coupled to numerous NVM elements of a wordline which are themselves coupled to sense amplifiers, according to embodiments.

FIG. 2B depicts a diagram of the wiring for coupling wordline drivers to a plurality of NVM elements that are themselves coupled to respective sense amps. FIG. 2B depicts three wordline drivers 270A-C, each of which has two outgoing wires for the two unbalanced paths 271A-C, 272A-C, respectively. Wordline drivers 270A-C may include all components of FIG. 2A, including the wordline driver 210, the two substantially similar transmission gates 220, 230, and the relatively smaller passgate 240. For purposes of clarity, wires 272A-C will be discussed as the path equivalent to wordline path 260 of FIG. 2A, which is to say the path that is coupled to the current-limiting transmission gate. It is to be understood that wires 271A-C could be the path equivalent to wordline path 260 of FIG. 2A in other embodiments, however.

Wires 271A-C are coupled to FETs on the bitline complement 291 of NVM elements 280A-I. Conversely, wires 272A-C are coupled to FETs on the bitline true 292 of NVM elements 280A-I. For example, wordline driver 270A is coupled to wires 271A and 272A. Wires 271A, 272A are coupled to the NVM elements 280A-C on the wordline of wordline driver 270A. Specifically, wire 271A is coupled to the three FETs on the bitline complementary 291A-C of NVM elements 280A, 280B, and 280C, respectively. Likewise, wire 272A is coupled to the three FETs on the bitline true 292A-C of NVM elements 280A, 280B, and 280C, respectively.

FETs 280 are likewise coupled to respective sense amps 290 as shown in FIG. 2B. Sense amps 290A-C determine the logical state of NVM elements 280 in corresponding bitline columns. After logical values are determined by the sense amps 290A-C, this data is sent through control logic known to one skilled in the art (e.g., a set of OR gates) to determine whether any logical values of the NVM elements 280 are a value (e.g., a logical one) other than the default value (e.g., a logical zero). For example, the control logic may determine that both NVM elements 280D and 280E hold logical ones. If such a non-default value were identified, the control logic would balance the wordline driver for the wordline of the non-default values, in this case wordline driver 270B.

NVM elements 280A-I of FIG. 2B have spaces between them for the sake of clarity. It is to be understood that in actuality NVM elements 280A-I would be constructed as close together as physically possible for space considerations.

Figure 3:
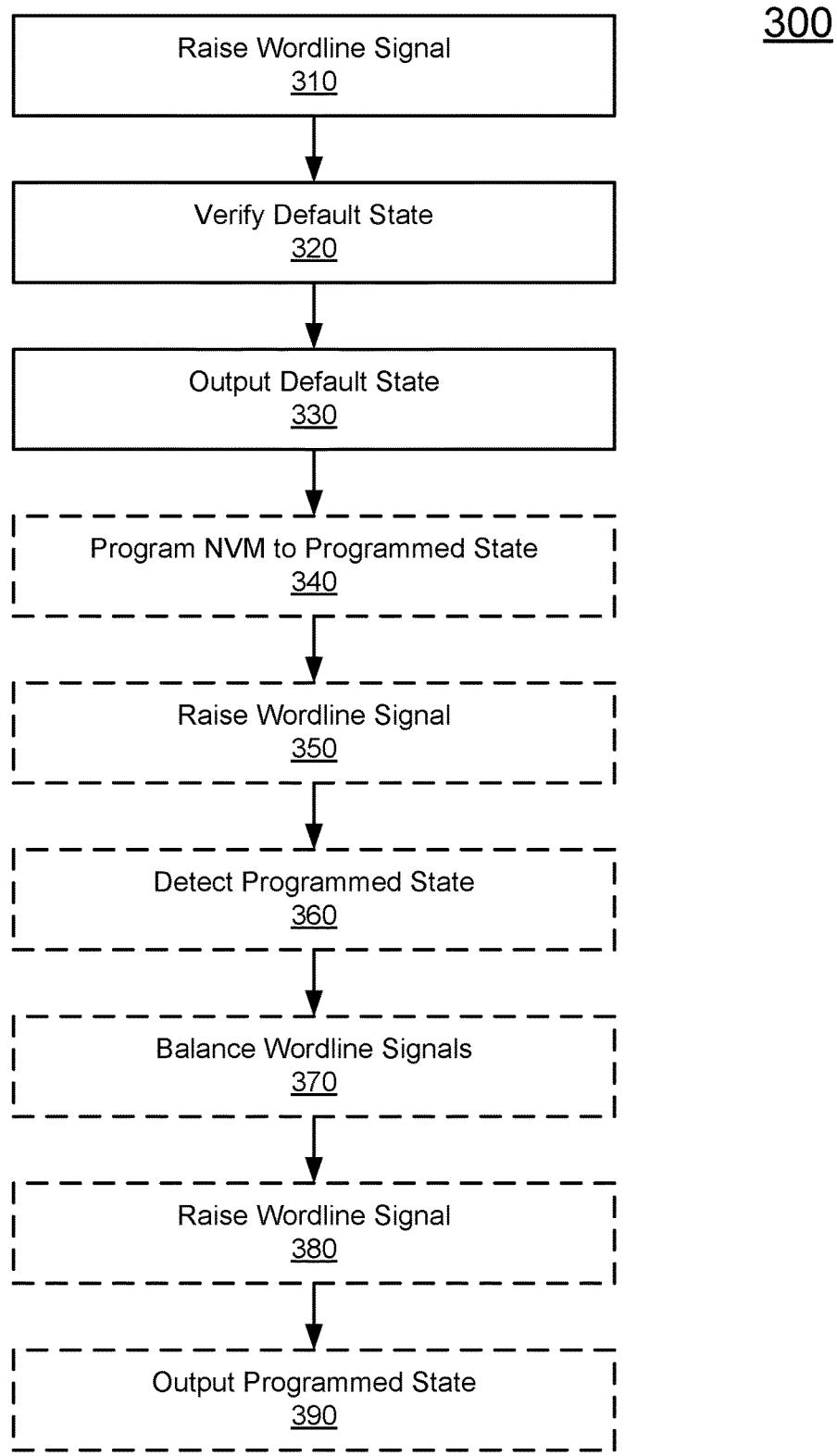
FIG. 3 depicts a method for providing an NVM element utilizing FETs with a default logical state, according to embodiments.

FIG. 3 depicts a method 300 of using unbalanced wordline drivers for an NVM array to provide NVM elements of the array with default values. The NVM arrays may be similar to the NVM elements array with unbalanced wordline drivers described in FIG. 1, FIG. 2A and FIG. 2B herein. The NVM element may be a component of a circuit. The circuit may include any number of NVM elements within an NVM element array as described herein. The visual arrangement of blocks in the flowchart of FIG. 3 is not to be construed as limiting the order in which the individual acts/operations may be performed, as certain embodiments may perform the operations of FIG. 3 in alternative orders.

At block 310 a wordline signal of an NVM element is raised. The NVM element may include two FETs, one FET coupled to the bitline true of the NVM element and the other FET coupled to the bitline complement of the NVM element. The two FETs are substantially similar to each other. Specifically, the two FETs may have substantially similar channel lengths.

The wordline signal may be unbalanced, such that the slew going into one FET of the NVM element will be higher than the slew rate going into the other FET. The wordline signals are unbalanced as a result of a standard wordline driver driving two disparate signals. One signal of the wordline driver may be for a first set of FETs of the NVM elements of the respective wordline, while the other signal is for the complement FETs of the NVM elements of the respective wordline. Specifically, one signal may be coupled to bitline true FETs of NVM elements of the respective wordline, while the other signal of the wordline driver is coupled to the bitline complement FETs of NVM elements of the respective wordline. The signals may be disparate as a result of disparate transmission gates between the wordline driver and the NVMs, where one of the transmission gates is current-limiting relative to the other transmission gate. As described herein, the current-limiting transmission gate may be coupled to the signal for the bitline true FETs resulting in a default logical state of zero, though it is to be understood that other configurations are also possible.

At block 320 the default logical state of the NVM element is read. The logical state of the NVM element is a predetermined/default logical state due to the unbalanced signals resulting in the fast FET reliably beating the slow FET as described herein. The default logical state may be read by the sense amplifier as described herein. Upon being read by the sense amplifier, control logic of the NVM macro may verify that the logic values of NVM elements read as this default value. The control logic may be any combination of logic gates known to one skilled in the art to verify logic values, such as a combination of OR logic gates. In response to verifying that the NVM elements of a wordline read as default logical values, at block 330 the default logical state is sent to the primary output. The primary output may send the logical zero value of the NVM element to the circuit which includes the NVM element.

At block 340 the NVM element may be programmed to a specific logical state. In some embodiments, programming an NVM element entails changing the NVM element to an alternate logical state (e.g., from a default logical state of logical zero to logical one, or from a default logical state of logical one to logical zero). Programming the NVM element may comprise increasing the Vt of the fast FET as described herein, such that the greater current switches which bitline it flows through (e.g., the greater current is forced to flow through a bitline which the greater current did not flow through when the NVM element was in the default logical state). Once the NVM element the wordline line signal may be again raised at block 350.

At block 360 the NVM macro may detect that the NVM element has been programmed. The NVM macro may detect that the NVM element has been programmed with the same control logic of block 320. The control logic may verify that the NVM element has been programmed to a logical state (e.g., logical one) other than the default logical state (e.g., logical zero). The control logic may include any combination of logic gates known to one skilled to one skilled in the art for this purpose, such as a sequence of OR gates.

At block 370 the wordline signals for the wordline are balanced. The wordline signals may be balanced by deactivating a current-limiting transmission gate on the current-limited path and activating a transmission gate that is substantially similar to the transmission gate on the paired wordline path, as described herein. The control logic may deactivate the current-limiting transmission gate and activate the substantially similar transmission gate by any technique known to one skilled in the art. Once the wordline signals have been balanced the wordline signals may be raised as described herein at block 380.

At block 390 the programmed state of the NVM element may be routed to the primary output. The programmed state of the NVM element may be output to the circuit of the NVM element. The programmed state may be read by the sense amplifier as described above before being outputted.

Figure 4:
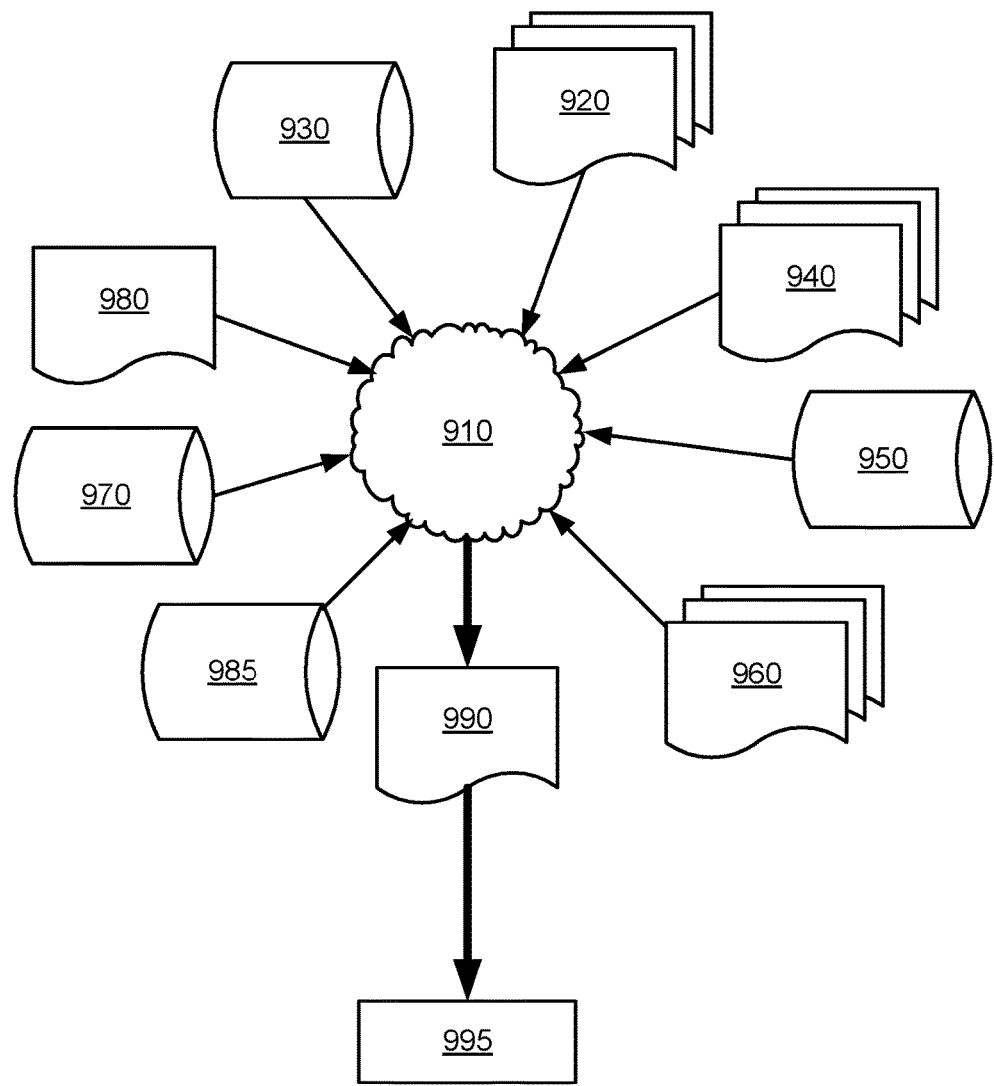
FIG. 4 depicts a flow diagram of a design process used in semiconductor design, manufacture, and/or test.

FIG. 4 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIG. 1, FIG. 2A, and FIG. 2B. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 4 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIG. 1, FIG. 2A, and FIG. 2B. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIG. 1, FIG. 2A, and FIG. 2B to generate a Netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a nonvolatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including Netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIG. 1, FIG. 2A, and FIG. 2B. In one embodiment, design structure 990 may comprise a compiled, executable HDL simulation model that functionally simulates the devices shown in FIG. 1, FIG. 2A, and FIG. 2B.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIG. 1, FIG. 2A, and FIG. 2B. Design structure 990 may then proceed to a stage 995 where, for example, design structure 990: proceeds to tape-out, is released to manufacturing, is released to a mask house, is sent to another design house, is sent back to the customer, etc.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. An array of non-volatile memory (NVM) elements utilizing field effect transistors (FETs) comprising:
    a wordline with at least one NVM element, wherein the at least one NVM element includes a first FET coupled to bitline true of the at least one NVM element and a second FET coupled to bitline complement of the at least one NVM element, wherein the first FET is substantially similar to the second FET;
    a first negative channel FET (NFET) coupled to the bitline complement and a second NFET coupled to the bitline true, the first NFET configured to pull the bitline true toward ground in response to the bitline complement reaching a first voltage to give the at least one NVM element a default logical value, the second NFET configured to pull the bitline complement toward ground in response to the bitline true reaching a second voltage to give the at least one NVM element a programmed logical value; and
    at least one wordline driver for the wordline coupled to the at least one NVM element, wherein the at least one wordline driver is coupled to the at least one NVM element such that a first path from the at least one wordline driver is coupled to the first FET and a second path from the at least one wordline driver is coupled to the second FET, wherein the first path is current-limited respective to the second path such that a first slew rate between the at least one wordline driver and the first FET is slower than a second slew rate between the at least one wordline driver and the second FET when a signal for the wordline is raised before the wordline has been programmed such that the bitline complement will reach the first voltage.

2. The array of NVM elements of claim 1, wherein:
    the at least one wordline driver consists of only one wordline driver;
    the first path is coupled to a first transmission gate and second transmission gate that are positioned in parallel between the only one wordline driver and the first FET, wherein the first transmission gate is a smaller transmission that is current-limiting respective to the second transmission gate, wherein the first transmission gate is activated and the second transmission gate is deactivated; and
    the second path is coupled to a third transmission gate that is positioned between the only one wordline driver and the second FET, wherein the third transmission gate is substantially similar to the second transmission gate.

3. The array of NVM elements of claim 2, further comprising control logic to deactivate the first transmission gate and activate the second transmission gate when the NVM element reads as the programmed logical value.

4. The array of NVM elements of claim 3, further comprising control logic to read the wordline while the second transmission gate is activated and the first transmission gate when the NVM element reads as the programmed logical value.

5. The array of NVM elements of claim 3, wherein the control logic includes a sequence of logical OR gates.

6. A method of managing non-volatile memory (NVM) elements, the method comprising:

raising a wordline signal for a wordline which is coupled to an NVM element, wherein the NVM utilizes both a first field effect transistor (FET) coupled to bitline true of the NVM element and a second FET that is substantially similar to the first FET coupled to bitline complement of the NVM element, wherein the wordline signal is raised by at least one wordline driver, wherein a first path from the at least one wordline driver is coupled to the first FET and a second path from the at least one wordline driver is coupled to the second FET, wherein the first path is current-limited respective to the second path;

reading a default logical state of the NVM element using a sense amplifier, wherein the default logical state is the result of the first slew rate being slower than the second slew rate due to the current-limited first path; and outputting the default logical state of the NVM element to a circuit of the NVM element.

7. The method of claim 6, the method further comprising:

programming the NVM element to a programmed state, wherein the programmed state is a different logical state than the default logical state;

reading the programmed state of the NVM element using the sense amplifier; and outputting the programmed state of the NVM element to the circuit of the NVM element.

8. The method of claim 7, wherein programming the NVM element further comprises increasing the Vt of the second FET.

9. The method of claim 7, wherein:

the at least one wordline driver consists of only one wordline driver;

the first path is coupled to a first transmission gate and second transmission gate that are positioned in parallel between the only one wordline driver and the first FET, wherein the first transmission gate is a smaller passgate that is current-limiting respective to the second transmission gate, wherein the first transmission gate is activated and the second transmission gate is deactivated; and the second path is coupled to a third transmission gate that is positioned between the only one wordline driver and the second FET, wherein the third transmission gate is substantially similar to the second transmission gate.

10. The method of claim 9, further comprising:

deactivating, using control logic, the first transmission gate in response to reading the programmed state of the NVM element; and activating, using control logic, the first transmission gate in response to reading the programmed state of the NVM element.

11. A design structure readable by a machine used in design, manufacture, or simulation of an integrated circuit with an non-volatile memory (NVM) element utilizing field effect transistors (FETs), the design structure comprising:

a wordline with at least one NVM element, wherein the at least one NVM element includes a first FET coupled to bitline true of the at least one NVM element and a second FET coupled to bitline complement of the at least one NVM element, wherein the first FET is substantially similar to the second FET;

a first negative channel FET (NFET) coupled to the bitline complement and a second NFET coupled to the bitline true, the first NFET configured to pull the bitline true toward ground in response to the bitline complement reaching a first voltage to give the at least one NVM element a default logical value, the second NFET configured to pull the bitline complement toward ground in response to the bitline true reaching a second voltage to give the at least one NVM element a programmed logical value; and at least one wordline driver for the wordline coupled to the at least one NVM element, wherein the at least one wordline driver is coupled to the at least one NVM element such that a first path from the at least one wordline driver is coupled to the first FET and a second path from the at least one wordline driver is coupled to the second FET, wherein the first path is current-limited respective to the second path such that a first slew rate between the at least one wordline driver and the first FET is slower than a second slew rate between the at least one wordline driver and the second FET when a signal for the wordline is raised before the wordline has been programmed such that the bitline complement will reach the first voltage.

12. The array of NVM elements of claim 11, wherein:

the at least one wordline driver consists of only one wordline driver;

the first path is coupled to a first transmission gate and second transmission gate that are positioned in parallel between the only one wordline driver and the first FET, wherein the first transmission gate is a smaller passgate that is current-limiting respective to the second transmission gate, wherein the first transmission gate is activated and the second transmission gate is deactivated; and the second path is coupled to a third transmission gate that is positioned between the only one wordline driver and the second FET, wherein the third transmission gate is substantially similar to the second transmission gate.

13. The array of NVM elements of claim 12, further comprising control logic to deactivate the first transmission gate and activate the second transmission gate when the NVM element reads as the programmed logical value.

14. The array of NVM elements of claim 13, further comprising control logic to read the wordline while the second transmission gate is activated and the first transmission gate when the NVM element reads as the programmed logical value.

15. The array of NVM elements of claim 13, wherein the control logic includes a sequence of logical OR gates.

\* \* \* \* \*